United States Patent
Furushima (10) Patent No.: US 6,670,203 B2
(45) Date of Patent: Dec. 30, 2003

(54) METHOD FOR MANUFACTURING SEMICONDUCTOR LASER HAVING RECOMBINATION LAYER STRIPES IN CURRENT BLOCKING STRUCTURE

(75) Inventor: Yuji Furushima, Tokyo (JP)

(73) Assignee: NEC Corporation, Tokyo (JP)

( * ) Notice: Subject to any disclaimer, the term of this patent is extended or adjusted under 35 U.S.C. 154(b) by 62 days.

(21) Appl. No.: 09/994,703

(22) Filed: Nov. 28, 2001

(65) Prior Publication Data

US 2002/0075927 A1 Jun. 20, 2002

Related U.S. Application Data

(62) Division of application No. 09/175,341, filed on Oct. 20, 1998, now Pat. No. 6,337,870.

(30) Foreign Application Priority Data

Oct. 20, 1997 (JP) .............................................. 9-286430

(51) Int. Cl.[7] .............................................. H01L 21/20
(52) U.S. Cl. .............................. 438/22; 257/13; 372/43
(58) Field of Search ...................... 372/45, 43; 117/105; 438/43, 22; 257/13

(56) References Cited

U.S. PATENT DOCUMENTS

| 4,105,955 A | 8/1978 | Hayashi et al. ................ 372/45 |
| 5,250,462 A | 10/1993 | Sasaki et al. |
| 5,585,309 A | * 12/1996 | Mori et al. .................... 438/43 |
| 5,636,237 A | 6/1997 | Terakado et al. ............. 372/46 |
| 5,917,846 A | 6/1999 | Morimoto ..................... 372/46 |
| 5,982,798 A | 11/1999 | Okuda ......................... 372/46 |

FOREIGN PATENT DOCUMENTS

EP 0 720 243 A2 7/1996

(List continued on next page.)

OTHER PUBLICATIONS

Low Threshold and High Uniformity for Novel 1.3–$\mu$m–Strained InGaSaP MQW DC–PBH LD's Fabricated by the All–Selective MOVPE Technique Y. Sakata, Member, IEEE, Y. Inomoto, D. Saito, K. Komatus, and H. Hasumi, vol. 3, Mar. 3, 1997.

(List continued on next page.)

Primary Examiner—William David Coleman
(74) Attorney, Agent, or Firm—Sughrue Mion, PLLC (57) ABSTRACT

In the pattern of a selective growth mask for directly forming an active layer, open stripes for growing recombination layers to be inserted into a current blocking are formed in addition to an open stripe for growing the active layer. By this mask pattern, the position and band gap of the recombination layers are controlled. Whereby, at an arbitrary position in the vicinity of the active layer, recombination layers having an arbitrary band gap can be batch formed together with the active layer. Thus, a semiconductor laser element with an excellent high-temperature high-output characteristic can be fabricated with good uniformity and reproducibility.

9 Claims, 8 Drawing Sheets

FOREIGN PATENT DOCUMENTS

| JP | A 64-042888 | 2/1989 |
|---|---|---|
| JP | 6-338654 | 12/1994 |
| JP | 7-135368 A | 5/1995 |
| JP | 7-283490 | 10/1995 |
| JP | 8-236858 | 9/1996 |
| JP | A 08-264454 | 10/1996 |
| JP | A 09-036473 | 2/1997 |
| JP | A 09-036475 | 2/1997 |

OTHER PUBLICATIONS

Y. Sakata et al., Low Threshold and High Uniformity for Novel 1.3–μm–Stained InGaAsP MQW DC–PBH LD's Fabricated by the All–Selective MOVPE Technique, IEEE Photonics Technology Letters, vol. 9, No. 3, Mar. 1997, pp. 291–293.

Furushima Y et al.: "Improved high–temperature and high–power characteristics of 1.3μm m spot–size converter integrated all–selective metalorganic vapor phase epitaxy grown planar buried heterostructure laser diodes by newly introduced multiple–stripe recombination layers", 1998 International Conference of Indium Phosphide and Related Materials, Tsukuba, Japan, May $11^{th}$–$15^{th}$, 1998, vol. 38, No. 28, pp. 1234–1238, XP002157889, Japanese Journal of Applied Physics, Part 1 (Regular Papers, Short Notes & Review Papers, Feb. 1999, Publication Office, Japanese Journal Appl. Phys., Japan, ISSN: 0021–4922.

Sakata Y et al., "Low Threshold and High Uniformity for Novel 1.3–Mum–Strained in GAASP MQW DC–PBH LD's Fabricated by the All–Selective MOVPE Technique", IEEE Photonics Technology Letters, U.S., IEEE Inc. New York, vol. 9, No. 3, Mar. 1, 1997, pp. 291–293, XP000684395, ISSN: 1041–1135.

* cited by examiner

METHOD FOR MANUFACTURING SEMICONDUCTOR LASER HAVING RECOMBINATION LAYER STRIPES IN CURRENT BLOCKING STRUCTURE

CROSS REFERENCE TO RELATED APPLICATION

This is a divisional of application Ser. No. 09/175,341, now U.S. Pat. No. 6,337,870, filed Oct. 20, 1998, the disclosure of which is incorporated herein by reference.

BACKGROUND OF THE INVENTION

1. Field of the Invention

The present invention relates to a semiconductor laser element used for optical communication, optical information processing, optical disk devices, optical interconnection, etc., and also relates to a method for the manufacturing the same.

2. Description of the Related Art

Semiconductor lasers have so far been used in large amounts under various environments for optical communication, optical information processing, optical disk devices, optical interconnection, etc. Due to this, it is strongly demanded to manufacture, in large amounts and at low costs, semiconductor lasers having an excellent environmental resistance and, particularly, excellent high-temperature high-output characteristics. In order to realize this type of semiconductor laser, it is important to reduce the unnecessary leakage current which flows through the portions other than the active layer, due to which research and development of BH (buried heterostructure) lasers having various current confinement structures are being prosecuted.

Figure 1:
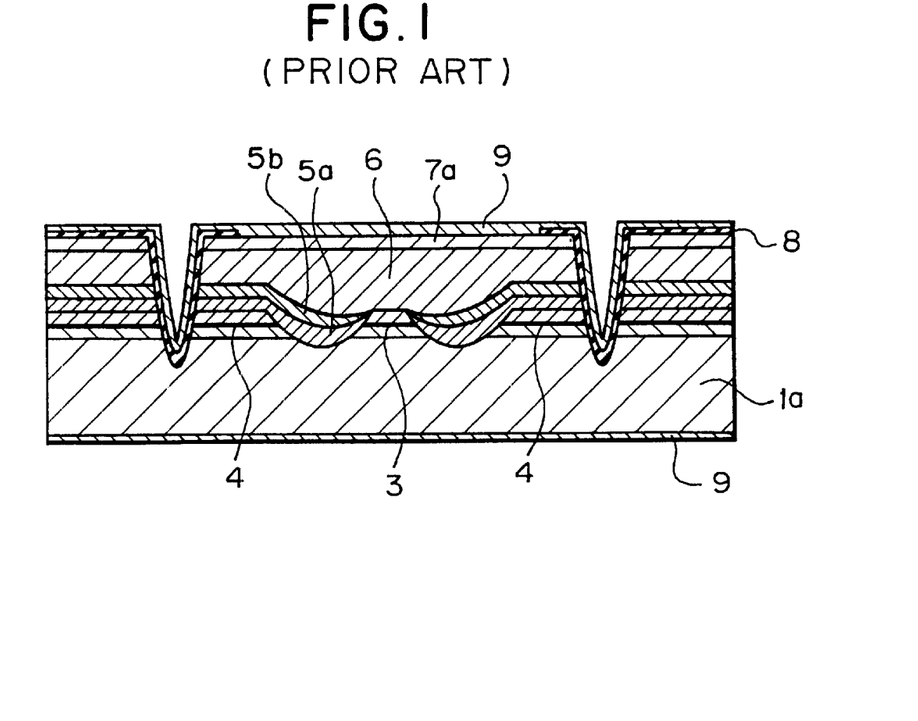
FIG. 1 is a sectional view showing a first conventional technique.

FIG. 1 is a sectional view showing a laser of a DC-PBH (Double Channel Planar Buried Heterostructure) structure as a BH laser with excellent high-temperature high-output characteristics. In FIG. 1, the reference symbol 1a denotes an n-InP substrate, numeral 3 denotes an active layer, numeral 4 denotes a recombination layer, symbol 5a denotes a p-InP blocking layer, symbol 5b denotes an n-InP blocking layer, numeral 6 denotes a p-InP buried layer, symbol 7a denotes a p-InGaAs contact layer, numeral 8 denotes an insulating film, and numeral 9 denotes an electrode. This structure is shaped in such a manner that the InGaAsP recombination layer 4 with a band gap narrower than that of InP is inserted into the current blocking layers 5a and 5b which comprise a pnpn thyristor structure of InP. The carriers which function as the gate current of the pnpn thyristor are made to emit light and recombined in this narrow band gap layer, whereby the current gain of the npn or pnp transistor constituting the thyristor is reduced, whereby the turn-on operation of the thyristor is suppressed to enhance the current confinement characteristic. The DC-PBH structure has so far been made in such a manner that, after the active layer 3 is grown flat on the n-InP substrate 1a, a mesa stripe is formed by etching, and, by the use of the LPE (Liquid Phase Epitaxy) method, a buried layer containing a current blocking layer is grown, but this manufacturing method using the measure of etching the semiconductor layer and growing the buried layer by the use of the LPE method is inferior in respect of controllability, uniformity and reproducibility.

Figure 2:
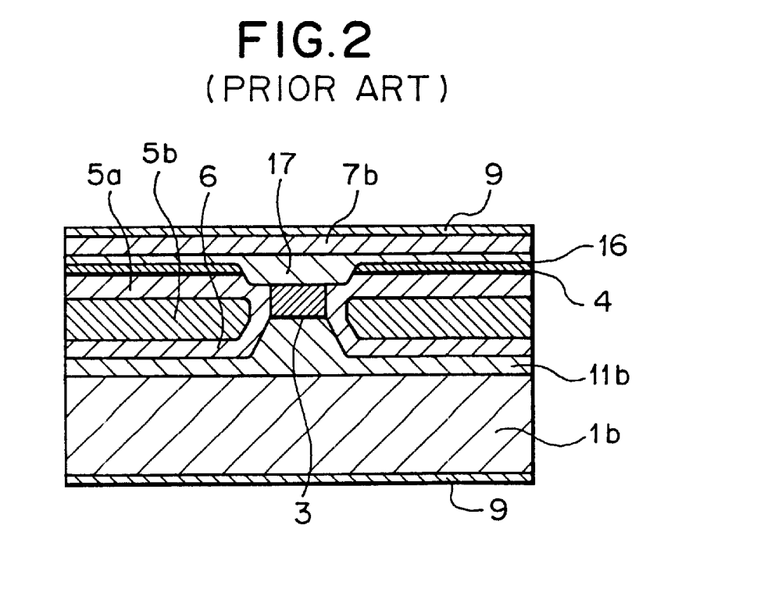
FIG. 2 is a sectional view showing a second conventional technique.

On the other hand, semiconductor lasers each constituted in such a manner that semiconductor lasers each having the BH structure fabricated by the use of the MOVPE (Metal Organic Vapor Phase Epitaxy) method which is excellent in respect of controllability, uniformity and reproducibility are being ardently studied and developed, but, in this case, also, it is proposed to improve the high-temperature high-output characteristic by inserting a recombination layer with a narrow band gap into the pnpn blocking layer. FIG. 2 is a sectional view showing the structure of the RIB-PBH (Recombination Layer Inserted Planar Buried Heterostructure) laser using a p-type substrate 1b which laser is disclosed in Japanese Patent Application Laid-Open No. 6-338654. Further, in Japanese Patent Application Laid-Open No. 8-236858, there is disclosed the fact that, by optimizing the band gap composition and position of the recombination layer 4 inserted into the current blocking layers 5a and 5b, the high-temperature high-output characteristics can be improved.

Further, in FIG. 2, the same component portions as those shown in FIG. 1 are referenced by the same reference symbols and numerals, whereby the repetition of the detailed description thereof is omitted. Referring to FIG. 2, the reference symbol 1b denotes a p-InP substrate, symbol 7b denotes an n-InGaAs contact layer, symbol 11b denotes a p-InP cladding layer, numeral 16 denotes a first n-InP buried layer, and numeral 17 denotes a second n-InP buried layer.

However, even if buried layer growth is performed by the use of the above-mentioned MOVPE method, there remains the problem that the dispersion in element characteristics resulting from the controllability, uniformity and reproducibility of the semiconductor layer etching cannot be avoided.

In contrast, as disclosed in IEEE, Photonics Technology Letters, March 1997, Vol. 9, No. 3, pp. 291 to 293, there is proposed a method according to which, by utilizing selective growth, the mesa stripe containing the active layer is directly formed, whereby the etching of the semiconductor layer is avoided; and thus, a BH laser with an excellent high-temperature high-output characteristic can be fabricated with excellent uniformity and reproducibility.

Figure 3A:
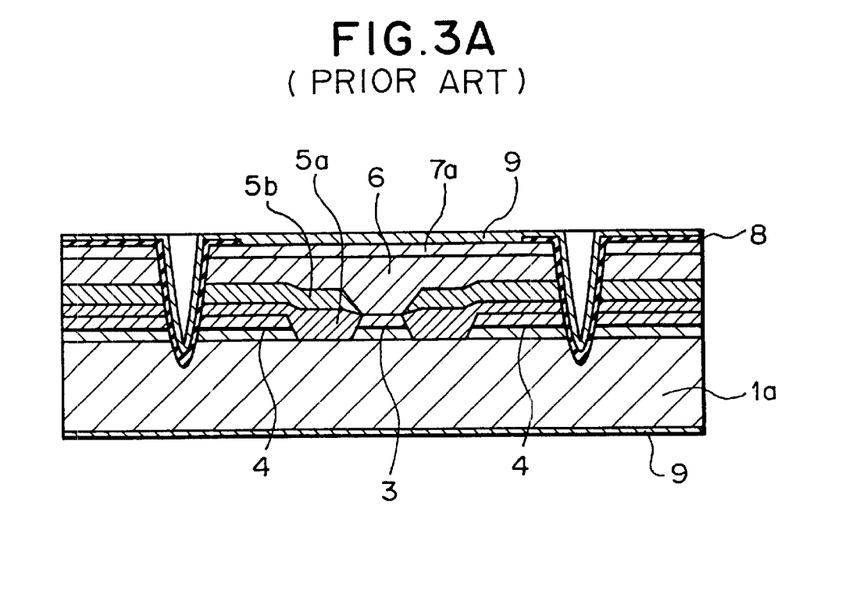
FIG. 3A is a sectional view showing a third conventional technique.
Figure 3B:
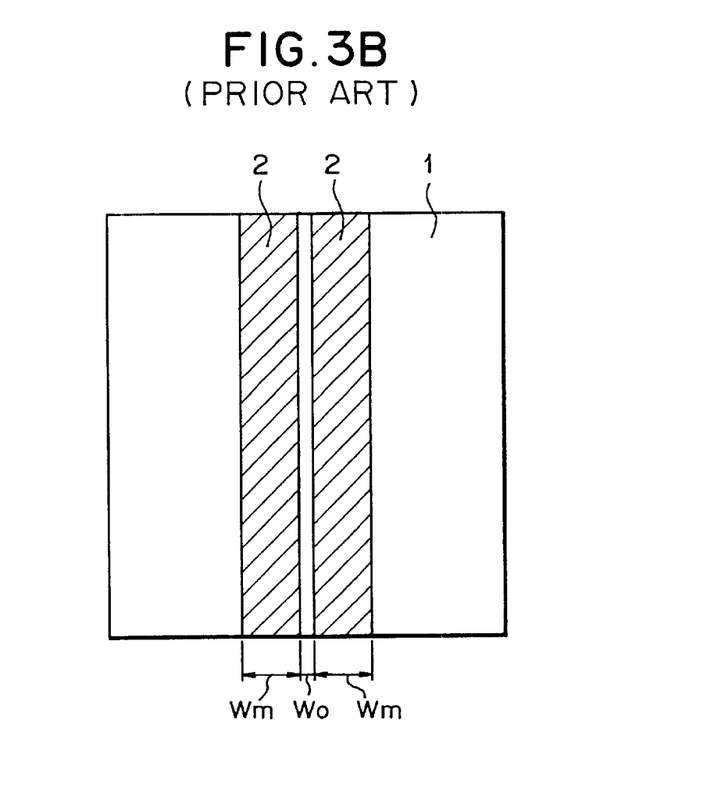
FIG. 3B is a plane pattern view thereof.

FIGS. 3A and 3B show the sectional structure of the DC-PBH laser fabricated on an n-type substrate 1a by the use of the above-mentioned conventional method and the pattern of a selective growth mask 2 used for the growth of an active layer 3. By setting the width Wm of the selective growth mask 2 to about 3 to 10 $\mu$m, the structure constituted in such a manner that a narrow band gap layer is inserted at a position apart by the mask width Wm from the active layer 3 is realized.

However, this conventional method has the drawback that it is impossible to control independently the band gap and position of the recombination layer 4 for the optimization thereof.

Further, considerable research has been focused recently on fabrication methods for semiconductor lasers, wherein the growth speed in selective etching and the dependence on the mask width of the structure are used to integrate spot-sized conversion waveguides into the semiconductor lasers.

Figure 4A:
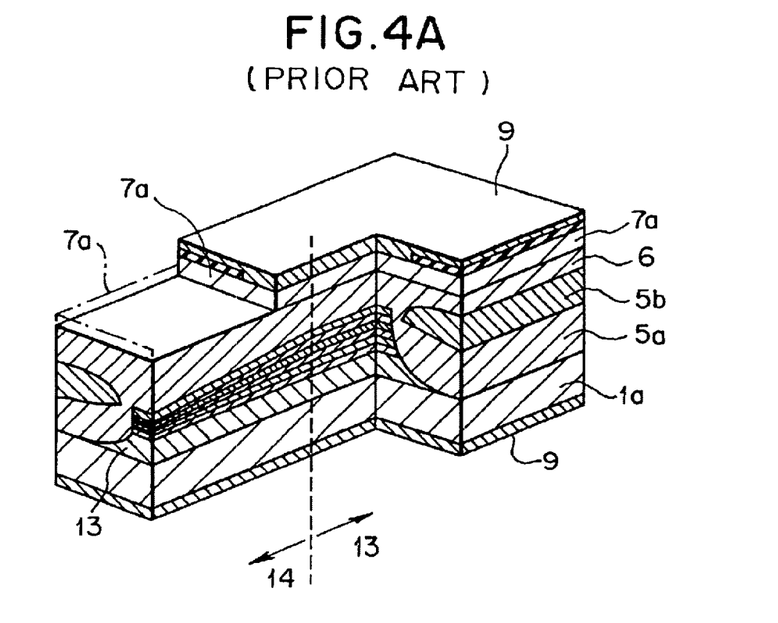
FIG. 4A is a cut-away perspective view showing a fourth conventional technique.
Figure 4B:
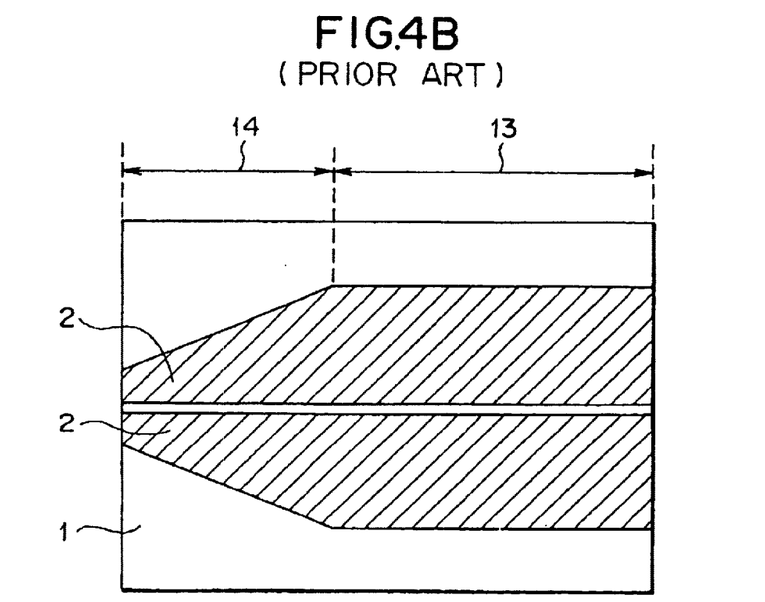
FIG. 4B is a plane pattern view thereof.

FIG. 4A shows the spot size conversion waveguide integrated laser disclosed in Japanese Patent Application Laid-Open No. 7-283490. Such a spot size conversion waveguide integrated laser is realized by setting the mask width of a laser region 13 to several tens of $\mu$m so that the difference of this mask width from the mask width at the end of a spot size conversion waveguide region 14 may become large. Due to this, as shown in FIG. 4A, the laser is constituted in such a manner that, as shown in FIG. 4A, the narrow band gap layer effective for improvement of the current confinement characteristic does not exist in the current blocking layers 5a and 5b in the vicinity of the active layer 3. As a result, a comparison between the characteristic of the laser element with the spot size conversion waveguide portion 14 removed and that of an element in which the recombination layer 4 exists in the vicinity of the active layer 3 reveals that this laser element is inferior in respect of its high-temperature high-output characteristic.

SUMMARY OF THE INVENTION

It is an object of the present invention to provide a semiconductor laser constituted in such a manner that the active layer comprised of a semiconductor layer is directly formed by selective growth and also to provide a method for the manufacturing the same, wherein a recombination layer which has an arbitrary band gap at an arbitrary position in the vicinity of the active layer can be batch-formed together with the active layer; and thus, semiconductor laser elements with excellent high-temperature high output characteristic and a method according to which the above-mentioned semiconductor laser elements can be manufactured in large amounts with excellent uniformity and reproducibility and at low costs can be provided.

The semiconductor laser according to the present invention comprises an active layer and at least one recombination layer; and the material constituting the recombination layer is in the shape of a stripe with a band gap narrower than that of the material constituting the current blocking layer. The active layer is formed of a semiconductor layer and is directly formed by selective growth, and the recombination layer is formed in the current blocking layer by selective growth at the same time as the active layer.

The stripe width of the recombination layer may be 20 µm or less. Also, the interval between the above-mentioned active layer and the recombination stripe nearest to the active layer may be 1 µm to 10 µm.

Further, the method for the manufacturing a semiconductor laser according to the present invention is a semiconductor laser manufacturing method wherein an active layer comprised of a semiconductor layer is directly formed by selective growth in such a manner that, by the use of a selective growth mask pattern which has at least one or more pairs of openings, other than the opening for growing the active layer, at both sides of the opening for growing the active layer, the active layer is selectively grown.

Further, the openings other than the opening for growing the active layer are each in the shape of a stripe with a width of 20 µm or less.

Further, the mask width between the opening for growing the active layer and the opening which is other than the active layer growth opening portion and is located nearest to the opening for growing the active layer is at least 1 µm to 10 µm.

Further, in a selective growth mask pattern for directly forming the active layer, open stripes for growing recombination layers to be inserted into a current blocking layer are formed besides the open stripe for growing the active layer, so that, by this mask pattern, the position and band gap of the recombination layers are controlled.

According to the present invention, it is ensured that, in an all-selective growth type BH laser which has excellent controllability, uniformity and reproducibility and in a method for the manufacture thereof, the position of band gap composition of a narrow band gap layer which is effective in improving the current confinement characteristic can be arbitrarily controlled for optimization thereof. As a result, the current confinement characteristic of the semiconductor laser is enhanced; and thus, semiconductor lasers with an excellent high-temperature high-output characteristic can be mass-produced at low manufacturing costs.

DESCRIPTION OF THE PREFERRED EMBODIMENT

Preferred embodiments of the present invention will now be described concretely by reference to the accompanying drawings. The same constituent portions as those shown in FIGS. 1 to 4B are referenced by the same reference numerals and symbols.

In the case of selective growth, the larger the area ratio between the mask opening portion and the mask portion is, that is, the larger the opening area is, the more the material fed per unit area of the opening portion is reduced; and the growth rate lowers accordingly. Here, in the case of the material of InGaAsP or the like, the composition of the material fed is also rendered so as to produce a short wavelength, so that, due to the increase in the quantum effect resulting from the decrease of the quantum well layer thickness, the band gap change thereof becomes larger than in the case of a bulk active layer.

In a conventional all-selective growth type DC-PBH laser using a selective growth mask pattern as in the case shown in FIG. 3B, the width Wo of the opening for growing the active layer is ordinarily set to a certain value of, e.g., about 1 to 2 µm from the viewpoint of the balance between the confinement of light in the active layer and the lateral mode stability. Here, the band gap of the recombination layer is larger than that of the active layer grown in a narrow opening, but, under this condition that Wo=constant, the band gap difference between the active layer and the recombination layer is determined depending on the mask width Wm; the larger the Wm is, the greater the band gap difference between them becomes. However, in this case, the distance between the active layer and the recombination layer increases, so that the band gap and position of the recombination layer cannot be set independently of each other.

Figure 5:
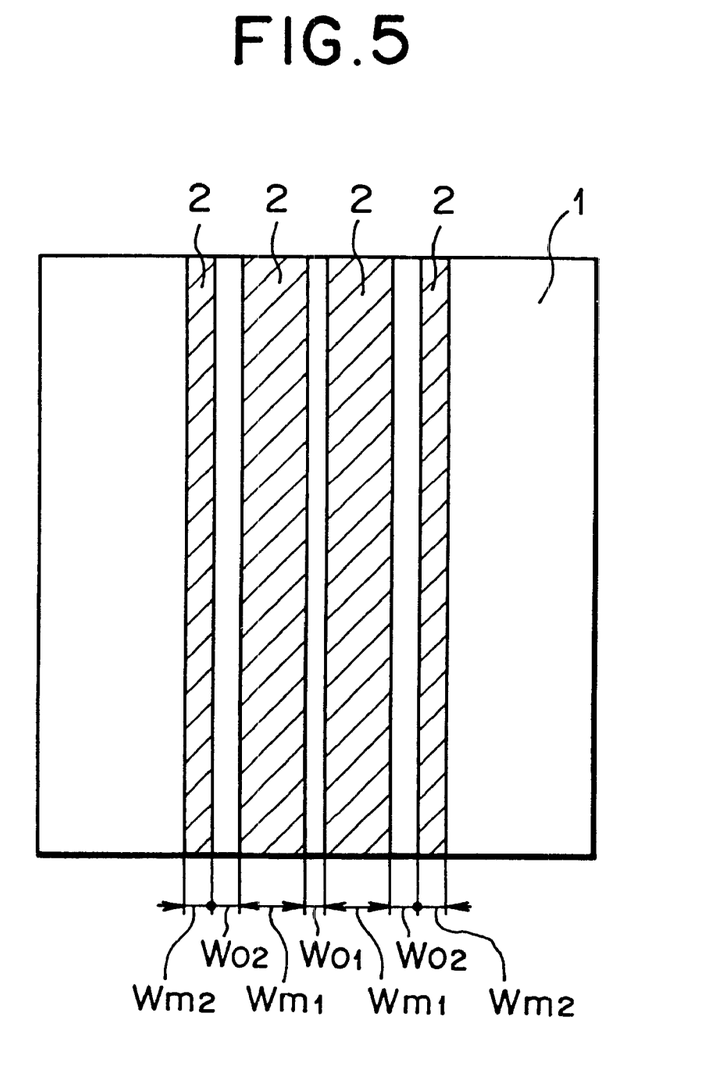
FIG. 5 is a schematic diagram explaining the operation of the present invention.

The present invention is characterized in that, as shown in FIG. 5 which will be described later in connection with an embodiment to follow, open stripes are also provided, in the pattern of selective growth masks 2, besides that of the active layer, but the present invention is identical with the conventional technique in the respect that the positional relationship between the active layer and the recombination layer is determined depending on a mask width Wm1. However, the band gap of the recombination layer changes with respect to any of the parameters, the mask widths Wm1, Wm2 and the mask opening widths Wo1, Wo2, so that, in case it is set that Wo1=constant, and Wm1=constant, that is, even under the condition that the positions of the active layer and the recombination layer are fixed, it is possible to control the band gap of the recombination layer by the use, as parameters, of the remaining Wo2 and Wm2. Accordingly, by controlling the position and band gap of the recombination layer independently of each other for optimization thereof, it becomes possible to fabricate a semiconductor laser with a current blocking layer structure in which the leakage current of electrons or holes is suppressed to a minimum.

Here, if the interval between the active layer and the recombination layer is too large, then the turn-on suppression effect of the pnpn blocking layer structure by the insertion of the narrow band gap layer is decreased; the current confinement characteristic deteriorates, but, conversely, if the interval is too small, the leakage current which flows into the recombination layer via the p type blocking layer, located beside the active layer, from the p type cladding layer on the active layer increases, since the potential, with respect to the holes, of the recombination layer is low. Therefore, the interval between the active layer and the recombination layer strip nearest to the active layer should desirably be 1 $\mu$m to 10 $\mu$m. Further, the stripe width Wo2 of the recombination layer is not particularly limited, but if Wo2 is too large, then the control range of the recombination layer composition by Wm2 becomes small, so that the stripe width Wo2 should desirably be set to the value of 20 $\mu$m or below.

Further, according to the present invention, it is ensured that, even if a laser with a spot size conversion waveguide integrated therein is fabricated by the use of selective growth, the laser can be made into the structure in which a narrow band gap layer effective in enhancing the current confinement characteristic is inserted in the current blocking layer in the vicinity of the active layer; in this case, the position and band gap of the recombination layer can also be controlled independently of each other as in the foregoing case.

Figure 6:
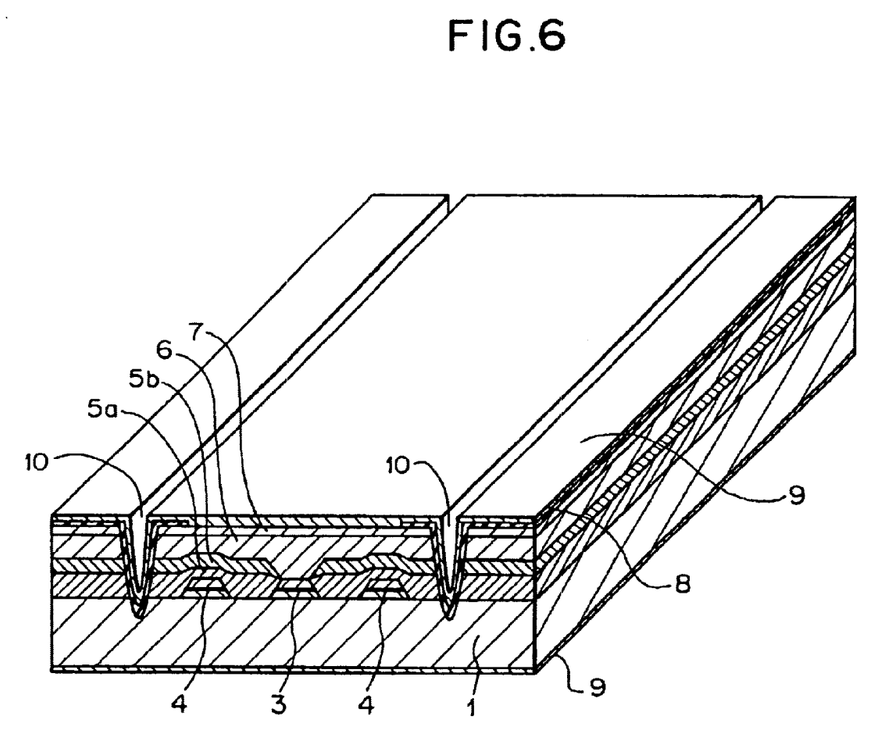
FIG. 6 is a cut-away perspective view showing a first embodiment of the present invention.

FIG. 6 shows the structure of the semiconductor laser according to a first embodiment of the present invention. As shown in FIG. 5, in a selective growth mask 2 formed on a semiconductor substrate 1, a stripe opening for growing an active layer and stripe openings for growing a recombination layer to be inserted into a blocking layer are pattern-formed, whereby the batch growth of the active layer 3 and the recombination layer 4 can be effected.

Referring to FIG. 6, an electrode 9 is formed on the lower surface of a substrate 1, while, on the upper surface, the active layer 3 and the recombination layer 4 are selectively formed; the active layer 3 and the recombination layer 4 are buried in a p-InP blocking layer 5a. In the region, excepting the active layer 3, lying on this p-InP blocking layer 5a, an n-InP blocking layer 5b is formed. On this n-InP blocking layer 5b, a p-InP buried layer 6 is formed so as to be contacted with the active layer 3. Further, on the p-InP buried layer 6, a contact layer 7 is formed. Further, a pair of electric isolation grooves 10 are formed at positions which sandwich the active layer 3 and the recombination layers 4 therebetween, and in a portion of each of these isolation grooves 10, an insulating film 8 is formed. Further, on the contact layer 7 and the insulating film 8, an electrode 9 is formed.

Figure 7A:
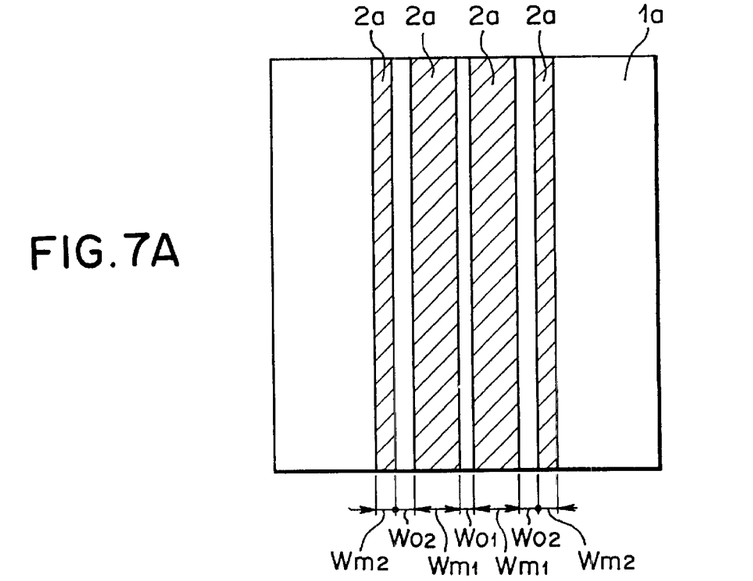
FIG. 7A is a plane pattern view of the first embodiment of the present invention.
Figure 7B:
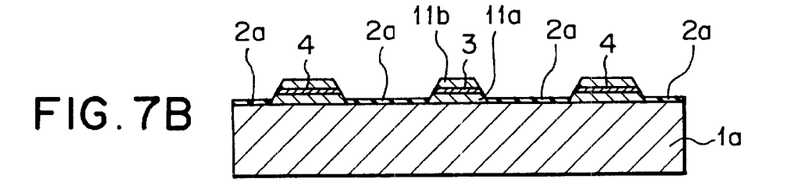
FIGS. 7B to 7D are sectional views showing the manufacturing method thereof in the order of manufacturing steps thereof.
Figure 7C:
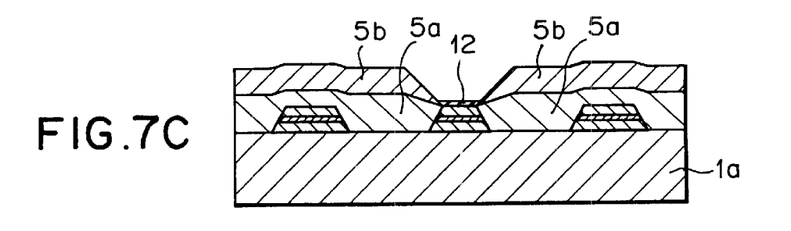
Figure 7D:
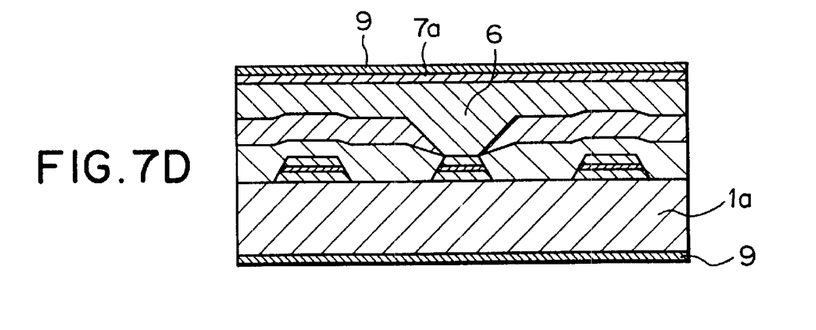

FIGS. 7A to 7D are to explain the method for the manufacture of the semiconductor laser according to this embodiment, of which FIGS. 7B to 7D are schematic diagrams showing the manufacturing steps of a Fabry-Perot laser (FP-LD) in the zone of 1.3 $\mu$m. Referring to FIG. 7A, the reference symbol 2a denotes an $SiO_2$ mask deposited on the surface of an n-InP substrate 1a by the use of the CVD method and patterned by the use of a photolithographic technique, before the execution of the selective growth. The mask width Wm1=3.0 $\mu$m, the mask width Wm2=3.0 $\mu$m, the opening width Wo1=1.5 $\mu$m, and the opening width Wo2=5.0 $\mu$m.

As shown in FIG. 7B, on the substrate (n-InP substrate 1a) on which the $SiO_2$ mask 2a has thus been formed, the following layers are successively grown with the film thickness and compositions in the open stripe portion for growing the active layer: That is, an n-InP cladding layer 11a (thickness: 0.2 $\mu$m, doping density: $1\times10^{18}$ $cm^{-3}$), an active layer 3 (quantum well number: 6, thickness: 0.2 $\mu$m, luminescence wavelength: 1.3 $\mu$m) which has an InGaAsP SCH and a strained MQW, and a p-InP cladding layer 11b (thickness: 0.1 $\mu$m, doping density: $7\times10^{17}$ $cm^{-3}$) are successively grown. Here, the respective InGaAsP recombination layer 4 grown in the open stripe portion for growing the recombination layer which open stripe portion has an opening width larger than that of the opening for growing the active layer comes to have a luminescence wavelength of 1.23 $\mu$m as a result of the reduction in growth rate thereof and the structure thereof rendered so as to emit a short wavelength.

Next, as shown in FIG. 7C, an $SiO_2$ film 12 is formed only on the mesa optical waveguide including the active layer 3 by photolithography, so that a current confinement structure consisting of a p-InP blocking layer 5a (thickness: 0.5 $\mu$m, doping density: $3\times10^{17}$ $cm^{-3}$) and an n-InP blocking layer 5b (thickness of 0.7 $\mu$m and doping density: $1\times10^{18}$ $cm^{-3}$) is grown.

Further, as shown in FIG. 7D, after the $SiO_2$ mask 12 is removed, and thereafter, a p-InP buried layer 6 and a p-InGaAs contact layer 7a are grown, and thereafter, an electrode 9 is formed. Finally a semiconductor laser with a resonator length of 300 $\mu$m is completed by cleavage.

The current/optical output characteristics of the semiconductor laser according to this embodiment turned out to be excellent; that is, in terms of the average values pertaining to 200 elements, the threshold current was 7.2 mA, and the slope efficiency was 0.32 W/A at 25° C., and the threshold current was 17.8 mA, and the slope efficiency was 0.25 W/A at 85° C.

In the case of FIG. 6 which shows the first embodiment of the present invention, the structure shown is a structure constructed in such a manner electrical isolation grooves are formed by the use of the ordinary etching technique for electrical isolation from the adjacent elements in the state of a bar (laser array) after the reduction of the element capacity and the cleavage thereof, but it is a matter of course that, even in case a laser array is constituted by such electric isolation grooves 10, the present invention is applicable.

Further, in the case of this embodiment, a Fabry-Perot cavity resonator type laser is referred to as the object laser, but the laser may alternatively be rendered into the DFB laser structure or the DBR laser structure; and further, as for the lasing wavelength thereof, it is not limited only to the 1.3 μm range referred to in the description of the foregoing embodiment, but any other wavelength range can be used including, for example, the visible wavelength range of, for example, 1.55 μm, 1.65 μm, 0.98 μm or 0.68 μm. Further, in this embodiment, a strained MQW structure using a strained quantum well layer is used, but an unstrained MQW structure or a strain compensation type MQW structure or a bulk active layer may also be used, instead; and, as the component material except InGaAsP/InP series, AlGaInAs/InP series, AlGaAs/GaAs series, AlGaInP/GaInP series and any other semiconductor material series can be used.

Figure 8:
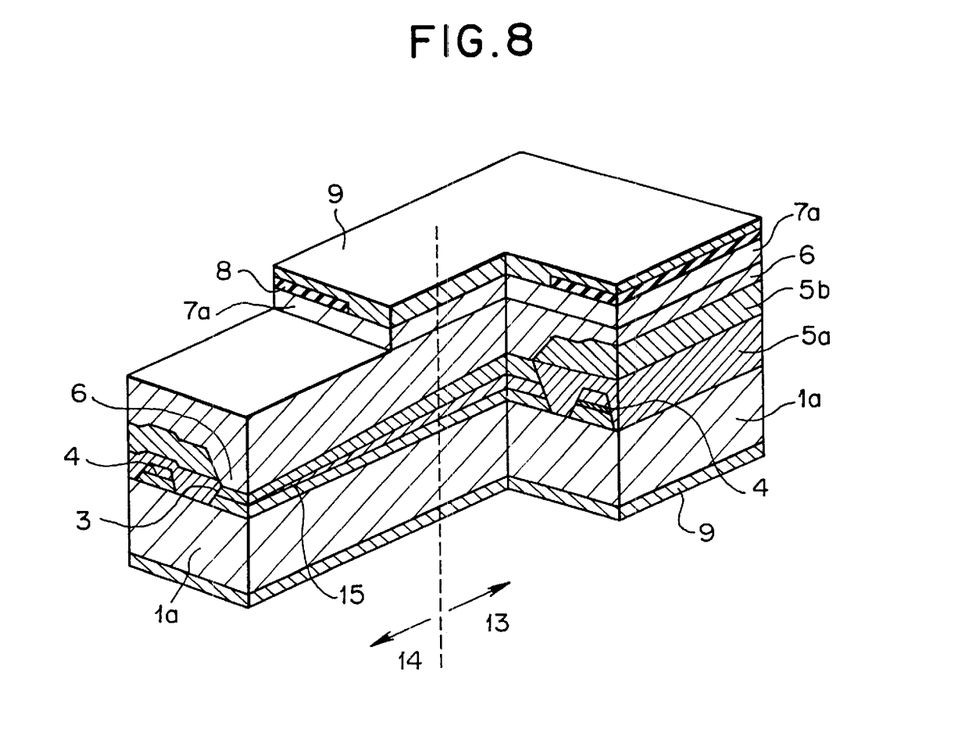
FIG. 8 is a cut-away perspective view showing a second embodiment of the present invention.

FIG. 8 shows the structure of a spot size conversion waveguide integrated semiconductor laser according to a second embodiment of the present invention.

Figure 9:
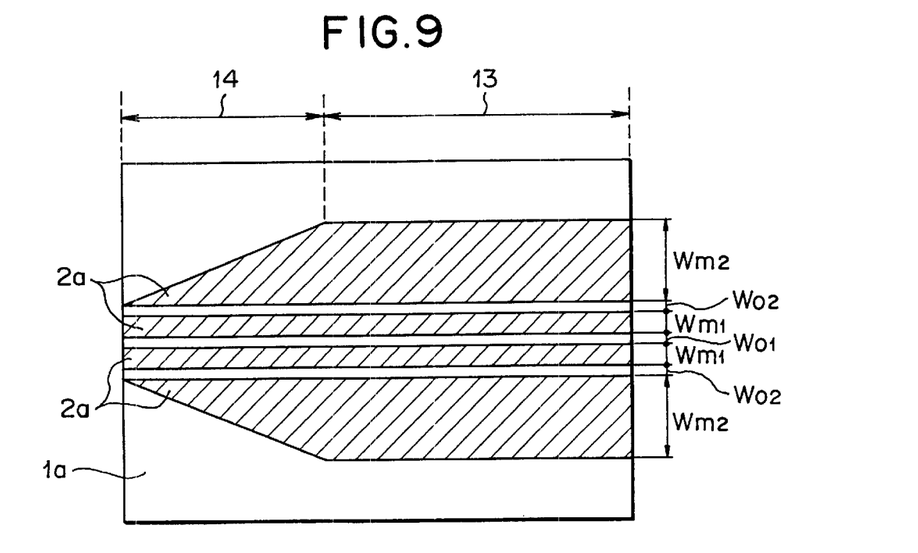
FIG. 9 is a plane pattern view of the second embodiment of the present invention.

In connection with another embodiment of the present invention, a selective growth mask pattern for fabricating a spot size conversion waveguide integrated FP-LD having the 1.3 μm range is shown in FIG. 9. Referring to FIG. 9, the stripe opening width Wo1 for growing the active layer is Wo1=1.3 μm, the stripe opening width Wo2 for growing the recombination layer inserted into the blocking layer is Wo2=4 μm, and the mask width Wm1=5 μm, which is fixed, while the mask width Wm2 is 50 μm in a laser region 13 having a length of 250 μm but is taperingly decreased from 50 μm to 0 μm in a spot size conversion waveguide region 14 with a length of 200 μm. By the use of such a selective growth mask pattern, it is ensured that, even in the laser region 13 which is required to have a wide mask width, as shown in FIG. 8, it becomes possible to form a structure constituted in such a manner that the recombination layer 4 with a small band gap inserted into the current blocking layer (5a, 5b), which structure has an excellent high-temperature high-output characteristic.

In this embodiment, likewise, the film thickness and structure in the active layer opening stripe portion in the laser region 13 were designed so as to be the same as those in the case of the first embodiment of the present invention, whereby the selective growth was performed. As a result, there were obtained a spot size conversion waveguide 15 which had a luminance wavelength of 1.14 μm at the output end and a film thickness ⅓ of that in the laser region portion, and a recombination layer 4 which had a luminance wavelength of 1.21 μm in the laser region 13. Further, a BH growth was carried out by the same manufacturing step as that employed in the first embodiment of the present invention to thereby fabricate an electrode structure for injecting a current to the whole laser region and that portion of the spot size conversion waveguide region which ranged over 40 μm, amounting to 290 μm. Cleavage was made for the whole element length to range over 450 μm, and thereafter, a coating with a reflectance of 90% was provided on the rear end surface, whereby a spot size conversion waveguide integrated semiconductor laser was formed. The spot size conversion waveguide integrated semiconductor laser according to this embodiment exhibited excellent current-optical output characteristics; the threshold current was 8.5 mA, and the slope efficiency was 0.38 W/A at 25° C., and the threshold current was 26.3 mA and the slope efficiency was 0.25 W/A at 85° C., and further, excellent narrow radiation angle optical light output characteristics were exhibited, that is, the full width half maximum of the far-field image was 12° in the horizontal direction and 13° in the vertical direction, all the above-mentioned being the average values obtained with respect to 100 elements.

In this embodiment, likewise, not only the above-mentioned FP laser structure but also any other laser structure such as the DFB laser structure or the DBR laser structure may be employed; the present invention is not limited by the lasing wavelength thereof and the component material thereof as in the case of the first embodiment. Further, in this embodiment, the selective growth mask width of the spot size conversion waveguide region is decreased linearly in a tapering manner, but the second embodiment of the present invention is not limited to a tapering shape, but, for example, the tapering shape may alternatively be made into such a curvilinear one as is more and more gently tapering towards the front end. The values of the mask width etc. are not limited to those indicated in connection with this embodiment, either.

Figure 10:
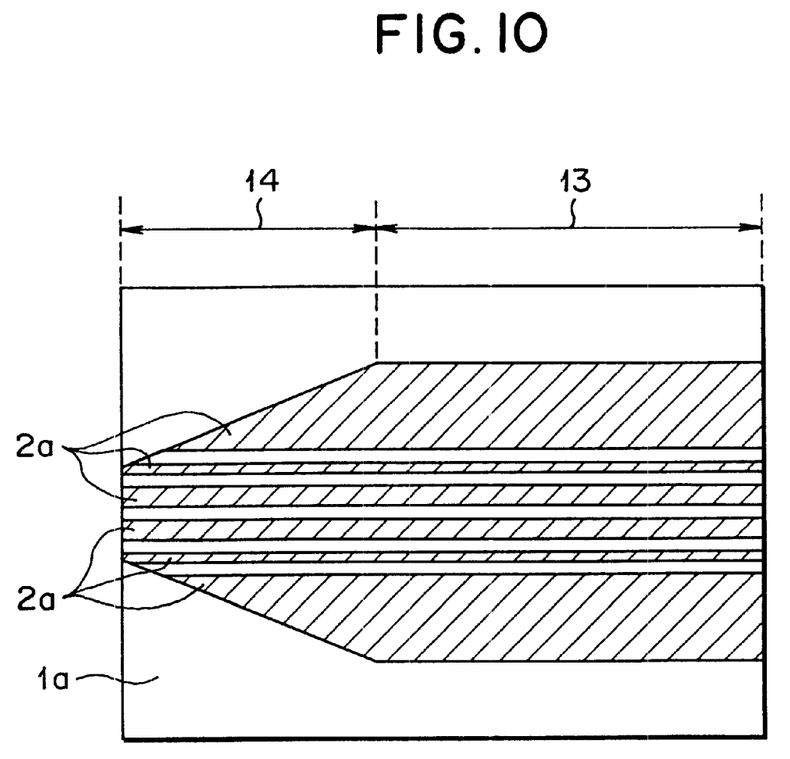
FIG. 10 is a schematic diagram showing a selective growth mask pattern formed in such a manner that, on both sides of the open stripe for growing an active layer, two pairs of recombination layer growing open-stripes exist.

As described above, in the first and second embodiments of the present invention, the case where a pair of open stripes for growing the recombination layers are patterned at both sides of the open stripe for growing the active layer is adopted, but, as shown in FIG. 10 for example, two or more pairs of open stripes for growing the recombination layers may exist at both sides of the open stripe for growing the active layer.

What is claimed is:

1. A method for manufacturing a semiconductor laser comprising the steps of directly forming an active layer made of a semiconductor layer by selective growth using a selective growth mask pattern which has at least one pair of opening portions, other than the opening portion for directly growing said active layer, at both sides of said opening portion for directly growing said active layer, wherein a growth rate of the semiconductor layer in the opening portion for directly growing said active layer is different than a growth rate of the semiconductor layer in the at least one pair of opening portions.

2. The method for the manufacture of a semiconductor laser according to claim 1, wherein the opening portions other than said opening portion for growing said active layer are each of a stripe shape have a width of 20 μm or less.

3. The method for the manufacture of a semiconductor laser according to claim 1, wherein the mask width between said opening portion for growing said active layer and the opening portion which is other than said opening portion for growing said active layer and is located nearest to said opening portion for growing said active layer is 1 μm to 10 μm.

4. A method for manufacturing a semiconductor laser comprising:

forming a mask on a substrate, said mask including a plurality of stripe-shaped openings bounded by mask on either side, said plurality of stripe-shaped openings comprising a first stripe-shaped opening of a first stripe width, and a second stripe-shaped opening of a second stripe width;

selectively growing an active layer in said first stripe-shaped opening at a first growth rate;

selectively growing a recombination layer in said second stripe-shaped opening at a second growth rate, simultaneously with said selectively growing an active layer in said first stripe-shaped opening, said first growth rate and said second growth rate being different; and forming a current blocking layer over said recombination layer.

5. The method for manufacturing a semiconductor laser according to claim 4, wherein said first stripe width and said second stripe width are different.

6. The method for manufacturing a semiconductor laser according to claim 5, wherein said second stripe-shaped opening is a nearest of the plurality of stripe-shaped openings to said first stripe-shaped opening;

wherein an opening of said second stripe-shaped is bounded by a first mask portion and a second mask portion, said first mask portion being between said first stripe-shaped opening and said second stripe-shaped opening, and said second mask portion being adjacent to said second stripe-shaped opening on a side opposite from said first mask portion, wherein a mask width of said first mask portion is different than a mask width of said second mask portion.

7. The method for manufacturing a semiconductor laser according to claim 4, wherein said second stripe width is 20 $\mu$m or less.

8. The method for manufacturing a semiconductor laser according to claim 4, wherein said second stripe-shaped opening is a nearest of the plurality of stripe-shaped openings to said first stripe-shaped opening;

wherein a mask width of the mask between said first stripe-shaped opening and said second stripe-shaped opening is 1 $\mu$m to 10 $\mu$m.

9. The method for manufacturing a semiconductor laser according to claim 4, wherein said active layer has a semiconductor band gap that is different than a semiconductor band gap of said recombination layer.

* * * * *